(12) United States Patent
Kalb

(10) Patent No.: US 6,970,503 B1
(45) Date of Patent: Nov. 29, 2005

(54) APPARATUS AND METHOD FOR CONVERTING ANALOG SIGNAL TO PULSE-WIDTH-MODULATED SIGNAL

(75) Inventor: Arthur Joseph Kalb, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/556,607

(22) Filed: Apr. 21, 2000

(51) Int. Cl.$^7$ .............................................. H03K 7/08
(52) U.S. Cl. .................................... 375/238; 341/143
(58) Field of Search ............................. 375/238, 239, 375/340, 342, 247, 245, 243; 341/143, 126, 341/118; 532/109, 110, 111; 317/172–177; 370/223; 34/144

(56) References Cited

U.S. PATENT DOCUMENTS

| | | | |
|---|---|---|---|
| 4,843,339 A | 6/1989 | Burt et al. ...................... 330/10 |
| 5,352,986 A | 10/1994 | Modgil et al. ................. 330/10 |
| 5,451,900 A * | 9/1995 | Haga et al. ..................... 330/10 |
| 5,457,435 A * | 10/1995 | Hoffman ....................... 332/110 |
| 5,519,361 A * | 5/1996 | Kim ............................ 332/109 |
| 5,672,998 A * | 9/1997 | Wittlinger ..................... 330/10 |
| 5,747,947 A * | 5/1998 | Hak ............................ 315/308 |
| 5,777,512 A | 7/1998 | Tripathi et al. .............. 330/207 |
| 5,796,359 A * | 8/1998 | Beard ........................... 341/143 |
| 5,886,586 A * | 3/1999 | Lai et al. ..................... 332/109 |
| 5,905,407 A * | 5/1999 | Midya .......................... 330/10 |
| 5,933,453 A * | 8/1999 | Lewison ....................... 375/238 |
| 5,940,019 A * | 8/1999 | Maejima ....................... 341/143 |
| 5,974,089 A * | 10/1999 | Tripathi et al. .............. 375/247 |
| 5,994,852 A * | 11/1999 | Lee ............................ 315/408 |
| 6,064,326 A * | 5/2000 | Krone et al. ................. 341/143 |
| 6,107,876 A * | 8/2000 | O'Brien ........................ 330/10 |
| 6,198,417 B1 * | 3/2001 | Paul ............................ 341/143 |
| 6,218,972 B1 * | 4/2001 | Groshong .................... 341/143 |
| 6,275,177 B1 * | 8/2001 | Ho et al. ..................... 341/143 |
| 6,307,493 B1 * | 10/2001 | Nestler ........................ 341/143 |
| 6,414,614 B1 * | 7/2002 | Melanson .................... 341/143 |
| 6,515,604 B2 * | 2/2003 | Delano ........................ 341/143 |
| 6,535,153 B1 * | 3/2003 | Zierhofer ..................... 341/143 |
| 6,587,670 B1 * | 7/2003 | Hoyt et al. ................... 455/71 |

OTHER PUBLICATIONS

John G. Kenney and L. Richard Carley, "Design of Multibit Noise-Shaping Data Converters", Analog Integrated Circuits and Signal Processing 3, 259-272 (1993), pps. 99-112.

Steven R. Norsworthy et al., "Delta-Signma Data Converters", Theory, Design, and Simulation, IEEE Circuits & Systems Society, The Institute of Electrical and Electronics Engineers, Inc. NY, pps. 403 and 404.

Josef Klugbauer-Heilmeier, "A Sigma-Delta Power Amplifier for Digital Input Signals", AES, An Audio Engineering Society Preprint, No. 4448 (G6), 102$^{nd}$ Convention 1997 Mar. 22-25, Munich, Germany, pps. 1-9.

J. Vanderkooy, "New Concepts in Pulse-Width Modulation", AES, An Audio Engineering Society Preprint, No. 3886 (G-1), 97$^{th}$ Convention Nov. 10-13, 1994, San Francisco, CA pps. 1-38.

* cited by examiner

*Primary Examiner*—Emmanuel Bayard
(74) *Attorney, Agent, or Firm*—Vedder Price Kaufman & Kammholz, P.C.

(57) ABSTRACT

A circuit for converting an analog signal to a discrete pulse-width-modulated (PWM) signal uses a delta-sigma amplifier and a discrete PWM stage to produce a discrete PWM output signal having lower in-band signal noise then a PDM system and a lower signal distortion then a continuous PWM system. A multiple bit quantization stage drives the discrete PWM stage.

57 Claims, 2 Drawing Sheets

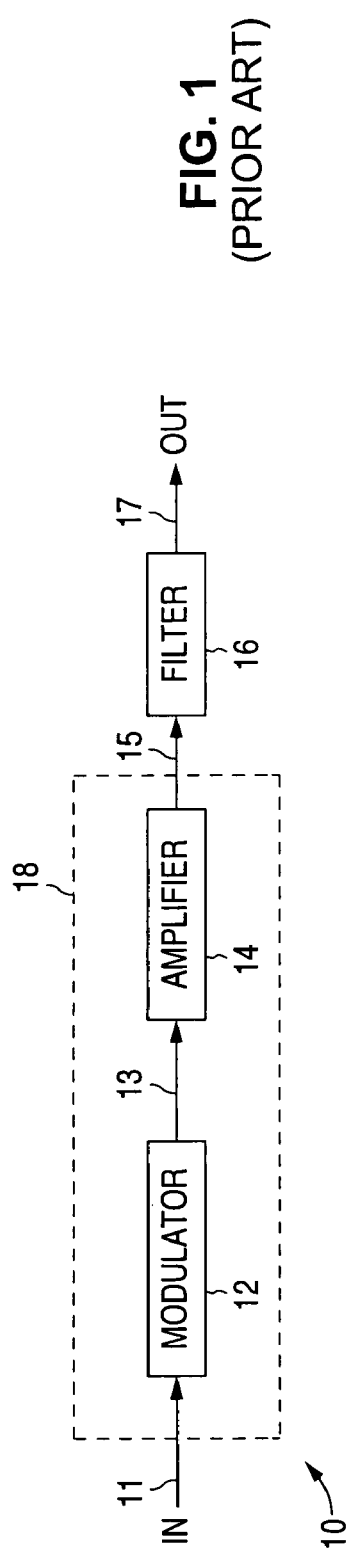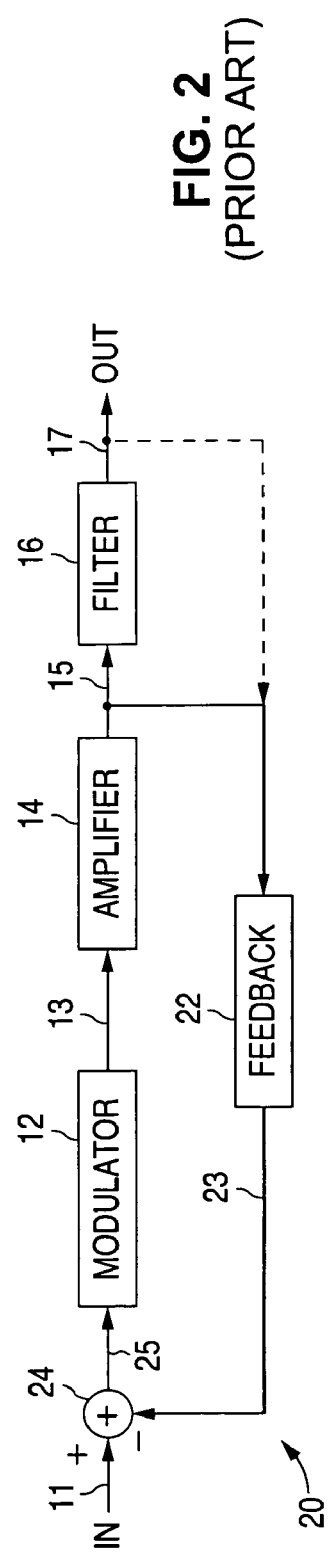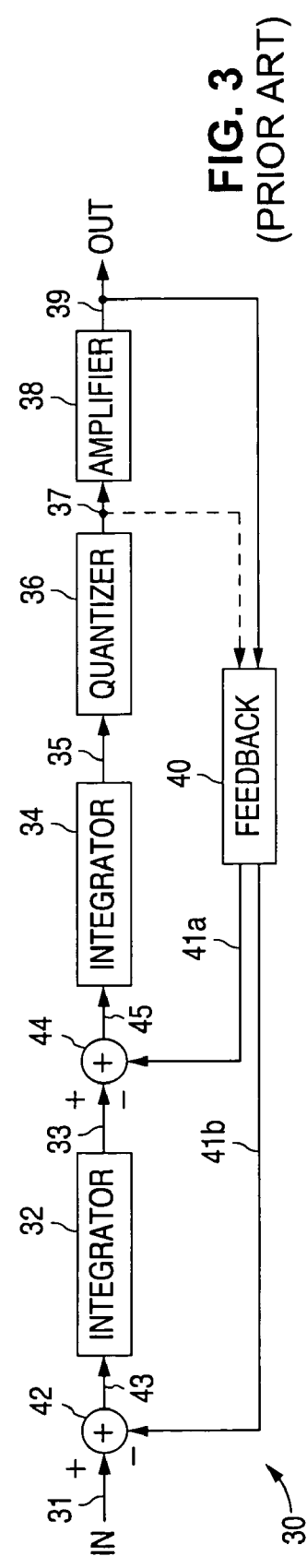

APPARATUS AND METHOD FOR CONVERTING ANALOG SIGNAL TO PULSE-WIDTH-MODULATED SIGNAL

BACKGROUND OF THE INVENTION

1. Field of the Invention

The present invention relates to oversampled, noise-shaping signal processing circuits, and in particular, to noise-shaped, high-efficiency amplifiers which convert an analog input signal to a pulse-width-modulated output signal.

2. Description of the Related Art

Referring to FIG. 1, a conventional high-efficiency amplifier system 10 includes, in various forms, a modulator 12, an amplifier 14 and a filter 16, interconnected substantially as shown. The analog input signal 11 is modulated by the modulator 12 and the modulated signal 13 is amplified by the amplifier 14 which is typically a switching circuit so as to maintain high-efficiency. The amplified signal 15 is filtered by the filter 16 to produce the desired analog output signal 17. The amplifier 14 is a switching amplifier so as to minimize power dissipation, thereby allowing the modulator 12 and amplifier 14 to be integrated within a single integrated circuit 18.

One problem associated with such a system 10 is that of power supply ripple being coupled into the output signal 17 through the amplifier 14. Accordingly, techniques are needed to increase power supply rejection, particularly when using switching amplifiers.

Referring to FIG. 2, one technique involves noise shaping the output signal spectrum. This is done by feeding back the output signal 15 from the amplifier 14 via a feedback network 22. The resulting feedback signal 23 is then differentially summed with the input signal 11 in a signal summer 24. The resulting sum signal 25 is modulated by the modulator 12, rather than the original input signal 11.

Alternatively, the filtered output signal 17 from the filter 16 can be fed back instead of the non-filtered signal 15. However, the problem associated with feeding back the filtered output signal 17 is the difficulty in creating a system which is stable and still has a high gain and wide bandwidth. This problem arises due to the fact that the filter 16 is typically a second order filter with a natural, or cutoff, frequency which is just outside the bandwidth of interest. The two poles associated with this filter 16 restrict the open loop unity crossover bandwidth of the overall loop to the cutoff frequency, which is approximately the signal bandwidth. This means that the in-band gain cannot be very large. As a result, suppression of power supply ripple, switching noise and other undesirable in-band signals is generally minimal.

On the other hand, feeding back the non-filtered signal 15, i.e., directly from the switching node output of the amplifier 14, the amount of feedback (i.e., with respect to gain and bandwidth) is less restricted thereby making it possible to use more sophisticated feedback techniques, such as noise shaping. Noise shaping techniques, sometimes referred to as delta-sigma techniques, allow for the selective reduction of quantization noise present at the switching output of the high-efficiency amplifier stage 14.

Referring to FIG. 3, a conventional delta-sigma loop includes a serial configuration of integrators 32, 34, quantizer 36, amplifier 38, feedback network 40 and signal summing stages 42, 44 interconnected in a loop substantially as shown. (This delta-sigma loop configuration is illustrated as a second order configuration, but it will be readily understood that the techniques discussed herein can be scaled as desired to higher order loop configurations as well.) The feedback network 40 can implement various forms of feedback techniques.

For example, when the amplifier output 39 is to be fed back, and such output 39 is an analog signal, the feedback network 40 may include filtering when sampled integrators 32, 34 are used. Alternatively, if the integrators 32, 34 are continuous time integrators, the feedback network 40 need not necessarily include filtering, but may provide only continuous time gain as needed for the feedback signals 41a, 41b. Alternatively, if the quantizer output 37 is to be fed back, the feedback network 40 may include discrete time feedback, such as a digital-to-analog conversion function, so as to provide appropriate analog feedback signals 41a, 41b. Various combinations and permutations of these types of feedback for continuous time and sampled integrators are discussed in more detail in U.S. Pat. No. 5,777,512, the disclosure of which is incorporated herein by reference.

Problems associated with conventional noise-shaped, high-efficiency amplifiers, such as those discussed above, have involved the choice between providing a pulse density modulated (PDM) signal or a continuous pulse-width modulated (PWM) signal as the output. If a PDM signal is used, the resulting output signal has low distortion levels, but contains a high amount of in-band signal noise. Conversely, a continuous PWM signal has less in-band signal noise, but a higher degree of signal distortion. Accordingly, it would be desirable to provide a noise-shaped, high-efficiency amplifier system with less in-band signal noise than a PDM system and less signal distortion than a continuous PWM system.

SUMMARY OF THE INVENTION

A circuit for converting an analog signal to a pulse-width-modulated (PWM) signal uses noise shaping techniques, such as a delta-sigma amplifier, along with a discrete PWM stage to produce a discrete PWM output signal having lower in-band signal noise than a PDM system and a lower signal distortion than a continuous PWM system. Additionally, a multiple bit quantization stage can be used to drive the discrete PWM stage.

An apparatus including a circuit for converting an analog signal to a pulse-width-modulated signal in accordance with one embodiment of the present invention includes an integration stage, a modulation stage and a feedback stage. The integration stage is configured to receive, combine and integrate an analog input signal and a set of one or more feedback signals and in accordance therewith provide a set of one or more integrated signals. The modulation stage, coupled to the integration stage, is configured to receive and modulate a final portion of the set of one or more integrated signals and in accordance therewith provide a discrete time pulse width modulated signal The feedback stage, coupled between the modulation stage and the integration stage, is configured to receive the discrete pulse width modulated signal and in accordance therewith provide a portion of the set of one or more feedback signals.

An apparatus including a circuit for converting an analog signal to a pulse-width-modulated signal in accordance with another embodiment of the present invention includes:

integration means for receiving, combining and integrating an analog input signal and a set of one or more feedback signals and in accordance therewith providing a set of one or more integrated signals;

modulation means for receiving and modulating a final portion of said set of one or more integrated signals and in accordance therewith providing a discrete time pulse width modulated signal; and feedback means for receiving the discrete time pulse width modulated signal and in accordance therewith providing a portion of the set of one or more feedback signals.

A method for converting an analog signal to a pulse-width-modulated signal in accordance with another embodiment of the present invention includes the steps of:

receiving, combining and integrating an analog input signal and a set of one or more feedback signals and in accordance therewith generating a set of one or more integrated signals;

generating a discrete time pulse width modulated signal in accordance with said set of one or more integrated signals; and feeding back the discrete time pulse width modulated signal as a first portion of the set of one or more feedback signals.

BRIEF DESCRIPTION OF THE DRAWINGS

FIG. 1 is a functional block diagram of a conventional high-efficiency switching amplifier system.

FIG. 2 is a functional block diagram of a conventional high-efficiency switching amplifier system using feedback for noise shaping.

FIG. 3 is a functional block diagram of a conventional high-efficiency switching amplifier system using delta-sigma noise shaping techniques.

DETAIL DESCRIPTION OF THE INVENTION

Figure 4:
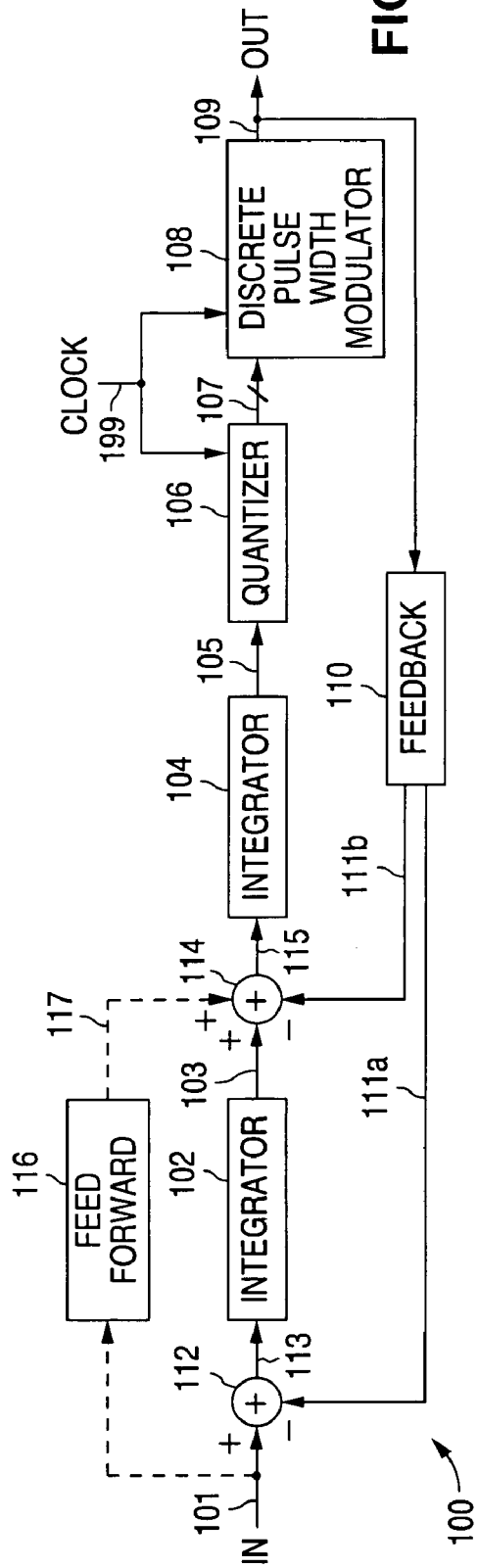
FIG. 4 is a functional block diagram of a high-efficiency switching amplifier system using noise shaping techniques in accordance with one embodiment of the present invention.

Referring to FIG. 4, a high-efficiency switching amplifier system 100 using noise shaping techniques in accordance with one embodiment of the present invention includes serially coupled integrators 102, 104, a quantizer 106, a discrete pulse-width modulator 108, a feedback network 110 and signal summers 112, 114, interconnected in a closed loop configuration substantially as shown. The input analog signal 101 is alternately summed with feedback signals 111a, 111b in the signal summers 112, 114 and integrated by the integrators 102, 104, in accordance with well-known delta-sigma techniques. (A second order delta-sigma configuration is shown and discussed herein, but it will be readily understood that higher order delta-sigma techniques can also be used in accordance with the present invention.) The resulting signal 105 is then quantized in a multiple-bit quantizer stage 106, and the multi-bit quantized signal 107 is converted to a discrete time PWM signal 109 by the discrete pulse-width modulator stage 108. This output signal 109 is an analog signal which is then fed back through the feedback network 110 to produce the feedback signals 111a, 111b used by the delta-sigma section.

In accordance with well-known techniques, the feedback network 110 can provide either continuous time feedback or discrete time feedback depending upon the nature of the integrators 102, 104. For example, if the integrators 102, 104 are continuous time integrators which inherently accept low frequencies and reject high frequencies, the feedback network 110 can merely provide continuous time gain as needed. Alternatively, if the integrators 102, 104 are sampled integrators, the feedback network 110 will provide anti-alias filtering (e.g., lowpass filtering for baseband feedback signals or bandpass filtering for feedback signals which are not baseband), plus continuous time gain as needed. (Various combinations and permutations of continuous time and discrete time feedback networks used with continuous time and sampled integrators are discussed in more detail in the aforementioned U.S. Pat. No. 5,777,512, the disclosure of which is incorporated herein by reference.) Further alternatively, the input analog signal 101 can be fed forward via a feed forward stage 116 (e.g., with signal gain or filtering characteristics as desired) with the resultant signal 117 then being summed with integrated signal 103 and feedback signal 111b. (Other possible combinations and permutations of feed forward configurations for the input signal and various ones of the integrated signals will be readily apparent to one of ordinary skill in such art.)

With respect to the quantizer 106 and discrete pulse-width modulator 108, it will be readily understood that, in accordance with well-known techniques, these elements can also be "merged" into a single functional unit. For example, an analog-to-discrete-time-pulse-width modulation conversion can be performed in such a manner that no multi-bit quantized signal 107 need be generated.

Figure 5:
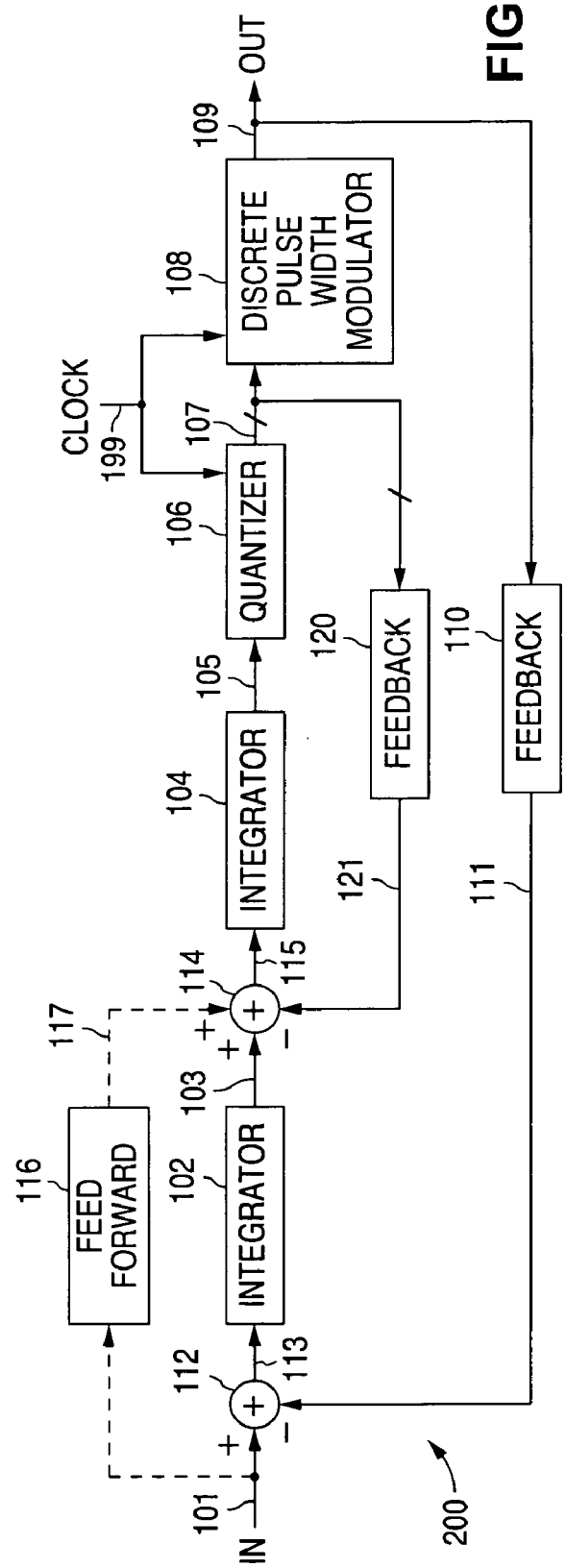
FIG. 5 is a functional block diagram of a high-efficiency switching amplifier system using noise shaping techniques in accordance with another embodiment of the present invention.

Referring to FIG. 5, an alternative system 200 in accordance with another embodiment of the present invention provides more discrete feedback paths. Feedback network 110 provides feedback for the discrete time PWM signal 109, as discussed above, while another feedback network 120 creates a minor feedback loop by feeding back the multibit quantized signal 107. In accordance with one embodiment, the major loop feedback network 110 is a continuous time feedback network for feeding back the analog discrete time PWM signal 109, while the minor loop feedback network 120 is a discrete time feedback network (e.g., a digital-to-analog conversion circuit) for feeding back the multi-bit digital quantized signal 107.

Based upon the foregoing, it can be seen that a noise-shaped, high-efficiency amplifier system in accordance with the present invention provides some of the advantages associated with continuous pulse-width modulation (low noise) while also providing some of the advantages associated with pulse density modulation (high linearity). Furthermore, multiple bit quantization is provided, thereby providing for a greater degree of inherent stability of the delta-sigma modulator. Hence, such a system is as close to PDM as possible while still maintaining a desirable degree of stability within the system.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a circuit for converting an analog signal to a pulse-width-modulated signal, comprising:

an integration stage configured to receive, combine and integrate an analog input signal and a set of one or more feedback signals and in accordance therewith provide a set of one or more integrated signals;

a modulation stage, coupled to said integration stage, configured to receive and modulate a final portion of said set of one or more integrated signals and in accordance therewith provide a discrete time pulse width modulated signal; and a first feedback stage, coupled between said modulation stage and said integration stage, configured to receive said discrete time pulse width modulated signal and in accordance therewith provide a first portion of said set of one or more feedback signals.

2. The apparatus of claim 1, wherein:

said integration stage comprises an adder circuit configured to receive and add said analog input signal and said first portion of said set of one or more feedback signals and in accordance therewith provide a first combined signal; and said integration stage is further configured to integrate said first combined signal and in accordance therewith provide said set of one or more integrated signals.

3. The apparatus of claim 1, wherein:

said integration stage comprises an adder circuit configured to receive and add said analog input signal and said first portion of said set of one or more feedback signals and in accordance therewith provide a first combined signal;

said integration stage is further configured to integrate said first combined signal and in accordance therewith provide an initial portion of said set of one or more integrated signals; and said integration stage further comprises a feed forward circuit configured to receive and feed forward said analog input signal and in accordance therewith provide a feed forward signal.

4. The apparatus of claim 1, wherein said integration stage comprises at least one continuous-time integrator circuit.

5. The apparatus of claim 1, wherein said integration stage comprises at least one sampled integrator circuit.

6. The apparatus of claim 1, wherein said modulation stage comprises:

a quantization stage, coupled to said integration stage, configured to receive and quantize said final portion of said set of one or more integrated signals and in accordance therewith provide a quantized signal; and a pulse width modulation stage, coupled to said quantization stage, configured to receive said quantized signal and in accordance therewith provide said discrete time pulse width modulated signal.

7. The apparatus of claim 6, wherein said quantization stage comprises a multibit quantization circuit configured to convert said final portion of said set of one or more integrated signals to a digital signal having multiple bits as said quantized signal.

8. The apparatus of claim 1, wherein said pulse width modulation stage comprises a discrete pulse width modulator circuit which includes:

an input stage configured to receive at least one digital input signal as said quantized signal; and an output stage configured to provide said discrete time pulse width modulated signal corresponding to said at least one digital input signal.

9. The apparatus of claim 1, wherein said first feedback stage comprises at least one continuous-time feedback circuit.

10. The apparatus of claim 1, wherein said first feedback stage comprises at least one discrete time feedback circuit.

11. The apparatus of claim 1, wherein said first feedback stage comprises an anti-aliasing stage configured to filter said discrete time pulse width modulated signal and in accordance therewith provide said first portion of said set of one or more feedback signals.

12. The apparatus of claim 1, further comprising a second feedback stage, coupled between said quantization stage and said integration stage, configured to receive said quantized signal and in accordance therewith provide a second portion of said set of one or more feedback signals.

13. The apparatus of claim 12, wherein:

said integration stage comprises a first adder circuit configured to receive and add said analog input signal and said first portion of said set of one or more feedback signals and in accordance therewith provide a first combined signal;

said integration stage is further configured to integrate said first combined signal and in accordance therewith provide a portion of said set of one or more integrated signals;

said integration stage further comprises a second adder circuit configured to receive and add said portion of said set of one or more integrated signals and said second portion of said set of one or more feedback signals and in accordance therewith provide a second combined signal; and said integration stage is still further configured to integrate said second combined signal and in accordance therewith provide another portion of said set of one or more integrated signals.

14. The apparatus of claim 12, wherein said integration stage comprises at least one continuous-time integrator circuit and at least one sampled integrator circuit.

15. The apparatus of claim 12, wherein said modulation stage comprises:

a quantization stage, coupled to said integration stage, configured to receive and quantize said final portion of said set of one or more integrated signals and in accordance therewith provide a quantized signal; and a pulse width modulation stage, coupled to said quantization stage, configured to receive said quantized signal and in accordance therewith provide said discrete time pulse width modulated signal.

16. The apparatus of claim 15, wherein said quantization stage comprises a multibit quantization circuit configured to convert said final portion of said set of one or more integrated signals to a digital signal having multiple bits as said quantized signal.

17. The apparatus of claim 12, wherein said pulse width modulation stage comprises a discrete pulse width modulator circuit which includes:

an input stage configured to receive at least one digital input signal as said quantized signal; and an output stage configured to provide said discrete time pulse width modulated signal corresponding to said at least one digital input signal.

18. The apparatus of claim 12, wherein said first feedback stage comprises at least one continuous-time feedback circuit and said second feedback stage comprises at least one discrete time feedback circuit.

19. The apparatus of claim 12, wherein:

said first feedback stage comprises an anti-aliasing stage configured to filter said discrete time pulse width modulated signal and in accordance therewith provide said first portion of said set of one or more feedback signals; and said second feedback stage comprises a digital-to-analog conversion stage configured to receive and convert said quantization signal and in accordance therewith provide said second portion of said set of one or more feedback signals.

20. An apparatus including a circuit for converting an analog signal to a pulse-width-modulated signal, comprising:

integration means for receiving, combining and integrating an analog input signal and a set of one or more feedback signals and in accordance therewith providing a set of one or more integrated signals;

modulation means for receiving and modulating a final portion of said set of one or more integrated signals and in accordance therewith providing a discrete time pulse width modulated signal; and first feedback means for receiving said discrete time pulse width modulated signal and in accordance therewith providing a first portion of said set of one or more feedback signals.

21. The apparatus of claim 20, wherein:

said integration means comprises adder means for receiving and adding said analog input signal and said first portion of said set of one or more feedback signals and in accordance therewith providing a first combined signal; and said integration means is further for integrating said first combined signal and in accordance therewith providing said set of one or more integrated signals.

22. The apparatus of claim 20, wherein:

said integration means comprises adder means for receiving and adding said analog input signal and said first portion of said set of one or more feedback signals and in accordance therewith providing a first combined signal;

said integration means is further for integrating said first combined signal and in accordance therewith providing an initial portion of said set of one or more integrated signals; and said integration means further comprises feed forward means for receiving and feeding forward said analog input signal and in accordance therewith providing a feed forward signal.

23. The apparatus of claim 20, wherein said integration means comprises at least one continuous-time integrator means for integrating said first combined signal in a continuous-time manner.

24. The apparatus of claim 20, wherein said integration means comprises at least one sampled integrator means for integrating said first combined signal in a sampled manner.

25. The apparatus of claim 20, wherein said modulation means comprises:

quantization means for receiving and quantizing said final portion of said set of one or more integrated signals and in accordance therewith providing a quantized signal; and pulse width modulation means for receiving said quantized signal and in accordance therewith providing said discrete time pulse width modulated signal.

26. The apparatus of claim 25, wherein said quantization means comprises multibit quantization means for converting said final portion of said set of one or more integrated signals to a digital signal having multiple bits as said quantized signal.

27. The apparatus of claim 20, wherein said pulse width modulation means comprises discrete pulse width modulator means including:

input means for receiving at least one digital input signal as said quantized signal; and output means for providing said discrete time pulse width modulated signal corresponding to said at least one digital input signal.

28. The apparatus of claim 20, wherein said first feedback means comprises at least one continuous-time feedback means for receiving said discrete time pulse width modulated signal and in accordance therewith providing said first portion of said set of one or more feedback signals in a continuous-time manner.

29. The apparatus of claim 20, wherein said first feedback means comprises at least one discrete time feedback means for receiving said discrete time pulse width modulated signal and in accordance therewith providing said first portion of said set of one or more feedback signals in a digital manner.

30. The apparatus of claim 20, wherein said first feedback means comprises anti-aliasing means for filtering said discrete time pulse width modulated signal and in accordance therewith providing said first portion of said set of one or more feedback signals.

31. The apparatus of claim 20, further comprising second feedback means for receiving said quantized signal and in accordance therewith providing a second portion of said set of one or more feedback signals.

32. The apparatus of claim 31, wherein:

said integration means comprises first adder means for receiving and adding said analog input signal and said first portion of said set of one or more feedback signals and in accordance therewith providing a first combined signal;

said integration means is further for integrating said first combined signal and in accordance therewith providing a portion of said set of one or more integrated signals;

said integration means further comprises second adder means for receiving and adding said portion of said set of one or more integrated signals and said second portion of said set of one or more feedback signals and in accordance therewith providing a second combined signal; and said integration means is still further for integrating said second combined signal and in accordance therewith providing another portion of said set of one or more integrated signals.

33. The apparatus of claim 31, wherein said integration means comprises at least one continuous-time integrator means and at least one sampled integrator means for receiving, combining and integrating said analog input signal and said set of one or more feedback signals and in accordance therewith providing said set of one or more integrated signals.

34. The apparatus of claim 31, wherein said modulation means comprises:

quantization means for receiving and quantizing said final portion of said set of one or more integrated signals and in accordance therewith providing a quantized signal; and pulse width modulation means for receiving said quantized signal and in accordance therewith providing said discrete time pulse width modulated signal.

35. The apparatus of claim 34, wherein said quantization means comprises multibit quantization means for converting said final portion of said set of one or more integrated signals to a digital signal having multiple bits as said quantized signal.

36. The apparatus of claim 31, wherein said pulse width modulation means comprises discrete pulse width modulator means including:
input means for receiving at least one digital input signal as said quantized signal; and
output means for providing said discrete time pulse width modulated signal corresponding to said at least one digital input signal.

37. The apparatus of claim 31, wherein:
said first feedback means comprises at least one continuous-time feedback means for receiving said discrete time pulse width modulated signal and in accordance therewith providing said first portion of said set of one or more feedback signals in a continuous-time manner; and
said second feedback means comprises at least one discrete time feedback means for receiving said discrete time pulse width modulated signal and in accordance therewith providing said first portion of said set of one or more feedback signals in a digital manner.

38. The apparatus of claim 31, wherein:
said first feedback means comprises anti-aliasing means for filtering said discrete time pulse width modulated signal and in accordance therewith providing said first portion of said set of one or more feedback signals; and
said second feedback means comprises digital-to-analog conversion means for receiving and converting said quantization signal and in accordance therewith providing said second portion of said set of one or more feedback signals.

39. A method for converting an analog signal to a pulse-width-modulated signal, comprising the steps of:
receiving, combining and integrating an analog input signal and a set of one or more feedback signals and in accordance therewith generating a set of one or more integrated signals;
generating a discrete time pulse width modulated signal in accordance with said set of one or more integrated signals; and
feeding back said discrete time pulse width modulated signal as a first portion of said set of one or more feedback signals.

40. The method of claim 39, wherein said receiving, combining and integrating step comprises:
receiving and adding said analog input signal and said first portion of said set of one or more feedback signals and in accordance therewith generating a first combined signal; and
integrating said first combined signal and in accordance therewith generating said set of one or more integrated signals.

41. The method of claim 39, wherein said receiving, combining and integrating step comprises:
receiving and adding said analog input signal and said first portion of said set of one or more feedback signals and in accordance therewith generating a first combined signal;
integrating said first combined signal and in accordance therewith generating an initial portion of said set of one or more integrated signals; and
feeding forward said analog input signal and in accordance therewith generating a feed forward signal.

42. The method of claim 39, wherein said receiving, combining and integrating step comprises generating said set of one or more integrated signals in a continuous-time manner.

43. The method of claim 39, wherein said receiving, combining and integrating step comprises generating said set of one or more integrated signals in a sampled manner.

44. The method of claim 39, wherein said generating step comprises:
quantizing a final portion of said set of one or more integrated signals and in accordance therewith generating a quantized signal; and
generating said discrete time pulse width modulated signal in accordance with said quantized signal.

45. The method of claim 44, wherein said quantizing step comprises converting said final portion of said set of one or more integrated signals to a digital signal having multiple bits as said quantized signal.

46. The method of claim 39, wherein said generating step comprises:
receiving at least one digital input signal as said quantized signal; and
generating said discrete time pulse width modulated signal in accordance with said at least one digital input signal.

47. The method of claim 39, wherein said step of feeding back said discrete time pulse width modulated signal as a first portion of said set of one or more feedback signals comprises feeding back said discrete time pulse width modulated signal as said first portion of said set of one or more feedback signals in a continuous-time manner.

48. The method of claim 39, wherein said step of feeding back said discrete time pulse width modulated signal as a first portion of said set of one or more feedback signals comprises feeding back said discrete time pulse width modulated signal as said first portion of said set of one or more feedback signals in a digital manner.

49. The method of claim 39, wherein said step of feeding back said discrete time pulse width modulated signal as a first portion of said set of one or more feedback signals comprises filtering said discrete time pulse width modulated signal.

50. The method of claim 39, further comprising the step of feeding back said quantized signal as a second portion of said set of one or more feedback signals.

51. The method of claim 50, wherein said receiving, combining and integrating step comprises:
adding said analog input signal and said first portion of said set of one or more feedback signals and in accordance therewith generating a first combined signal;
integrating said first combined signal and in accordance therewith providing a portion of said set of one or more integrated signals;
adding said portion of said set of one or more integrated signals and said second portion of said set of one or more feedback signals and in accordance therewith generating a second combined signal; and
integrating said second combined signal and in accordance therewith generating another portion of said set of one or more integrated signals.

52. The method of claim 50, wherein said receiving, combining and integrating step comprises receiving, combining and integrating said analog input signal and said set of one or more feedback signals and in accordance therewith generating at least one continuous-time integrated signal and at least one sampled integrated signal as said set of one or more integrated signals.

53. The method of claim 50, wherein said generating step comprises:

quantizing a final portion of said set of one or more integrated signals and in accordance therewith generating a quantized signal; and generating said discrete time pulse width modulated signal in accordance with said quantized signal.

54. The method of claim 53, wherein said quantizing step comprises converting said final portion of said set of one or more integrated signals to a digital signal having multiple bits as said quantized signal.

55. The method of claim 50, wherein said generating step comprises:

receiving at least one digital input signal as said quantized signal; and generating said discrete time pulse width modulated signal in accordance with said at least one digital input signal.

56. The method of claim 50, wherein:

said step of feeding back said discrete time pulse width modulated signal as a first portion of said set of one or more feedback signals comprises receiving said discrete time pulse width modulated signal and in accordance therewith generating said first portion of said set of one or more feedback signals in a continuous-time manner; and said step of feeding back said quantized signal as a second portion of said set of one or more feedback signals comprises receiving said discrete time pulse width modulated signal and in accordance therewith generating said first portion of said set of one or more feedback signals in a digital manner.

57. The method of claim 50, wherein:

said step of feeding back said discrete time pulse width modulated signal as a first portion of said set of one or more feedback signals comprises filtering said discrete time pulse width modulated signal; and said step of feeding back said quantized signal as a second portion of said set of one or more feedback signals comprises converting said quantization signal to an analog signal.

* * * * *